United States Patent
Haas et al.

(10) Patent No.: US 6,515,693 B1
(45) Date of Patent: Feb. 4, 2003

(54) CALIBRATION STATION FOR A PRINTHEAD ADAPTED TO COMPENSATE FOR THE WAVELENGTH SENSITIVITY OF AN IMAGE RECORDING MATERIAL

(75) Inventors: Daniel D. Haas, Webster, NY (US); Timothy J. Tredwell, Fairport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/604,521

(22) Filed: Jun. 29, 2000

(51) Int. Cl.$^7$ ................................ B41J 2/435
(52) U.S. Cl. ........................ 347/236; 347/246
(58) Field of Search .................. 347/236, 237, 347/240, 246, 247, 134, 133; 355/68, 38, 35; 356/484; 430/256; 396/563

(56) References Cited

U.S. PATENT DOCUMENTS

| | | | | |
|---|---|---|---|---|
| 4,375,067 A | * | 2/1983 | Kitamura | 347/133 |
| 4,533,238 A | * | 8/1985 | Miyazaki | 355/68 |
| 4,820,047 A | * | 4/1989 | Snyder | 356/484 |
| 5,033,114 A | | 7/1991 | Jayaraman et al. | 359/180 |
| 5,051,762 A | * | 9/1991 | Lea | 396/563 |
| 5,185,733 A | | 2/1993 | Finkelstein et al. | 369/47.52 |
| 5,216,659 A | | 6/1993 | Call et al. | 369/116 |
| 5,267,708 A | | 12/1993 | Harshbarger et al. | 244/121 |
| 5,275,327 A | | 1/1994 | Watkins et al. | 228/102 |
| 5,323,179 A | | 6/1994 | Sanger et al. | 347/237 |
| 5,561,494 A | * | 10/1996 | Terrashita | 355/38 |
| 5,687,156 A | | 11/1997 | Hurst, Jr. | 369/47.53 |
| 5,921,221 A | | 7/1999 | Davis, Jr. et al. | 123/436 |
| 5,966,394 A | | 10/1999 | Spurr et al. | 372/34 |
| 6,183,933 B1 | * | 2/2001 | Ishikawa et al. | 430/256 |
| 6,219,083 B1 | * | 4/2001 | Dhurjaty et al. | 347/246 |

FOREIGN PATENT DOCUMENTS

JP 61-127973 * 6/1986 .......... G03G/15/08

* cited by examiner

Primary Examiner—Hai Pham
(74) Attorney, Agent, or Firm—Nelson Adrian Blish

(57) ABSTRACT

A calibration station (34) for a printhead (20) adapted to provide a beam of electromagnetic radiation from a variable electromagnetic energy source onto a sensitive radiation medium, the calibration station (34), incorporates a sensor (26) disposed for sensing the beam (16) provided by the printhead (20), wherein the sensor (26) provides an output sensor signal indicative of the sensed power of the beam (16). A control circuit is adapted to accept the output sensor signal from the sensor and adjusts the variable electromagnetic energy source. A filter is disposed in the path of the beam (16) between the printhead (20) and sensor (26), adapted to transmit to the sensor (26) a portion of incident electromagnetic radiation over a predefined range of wavelengths, dependent upon a measured response characteristic of the radiation-sensitive medium.

30 Claims, 12 Drawing Sheets

CALIBRATION STATION FOR A PRINTHEAD ADAPTED TO COMPENSATE FOR THE WAVELENGTH SENSITIVITY OF AN IMAGE RECORDING MATERIAL

FIELD OF THE INVENTION

This invention generally relates to a printhead in an image producing apparatus and more particularly to a calibration station for adjusting output power of a printhead that writes onto an exposure-sensitive medium and to a method for calibrating output power of such a printhead.

BACKGROUND OF THE INVENTION

Pre-press color proofing is a procedure that is used by the printing industry for creating representative images of printed material. This procedure avoids the high cost and time required to actually produce printing plates and also avoids setting-up a high-speed, high-volume, printing press to produce a single example of an intended image. In the absence of pre-press proofing, the intended image may require several corrections and be reproduced several times to satisfy customer requirements which result in reduced profits. By utilizing pre-press color proofing, time and money are saved.

A laser thermal printer having half-tone color proofing capabilities is disclosed in commonly assigned U.S. Pat. No. 5,268,708 titled "Laser Thermal Printer With An Automatic Material Supply" issued Dec. 7, 1993, in the name of R. Jack Harshbarger et al. The Harshbarger et al., device is capable of forming an image on a sheet of thermal print receiver by transferring colorant from a roll (i.e., web) of colorant donor material to the thermal print receiver. This is achieved by applying a sufficient amount of thermal energy to the colorant donor material to form the image on the thermal print receiver. This apparatus generally comprises a material supply assembly; a lathe bed scanning subsystem, which includes a lathe bed scanning frame, a translation drive, a translation stage member, a laser printhead, and a vacuum imaging drum; and exit transports for exit of thermal print receiver and colorant donor material from the printer.

The Harshbarger et al. device writes an image using a plurality of laser disposed in an array at the laser printhead. In order to write the image, individual lasers are energized in coordination with imaging and timing signals to write the output image onto the donor material in a continuous swath. As is well known in the laser thermal printing art, there can be differences in output power from one laser to the next. A printer of this type can employ 20 or more lasers, each of which may vary from its neighbors in terms of the dependence of its output power upon wavelength. Because the achieved output density is dependent upon the applied power absorbed by the image-recording medium, imaging anomalies such as banding can result when lasers in the array emit different power levels, causing a print to be unacceptable for its intended purpose.

For printers of the type disclosed in the Harshbarger et al. patent, calibration procedures are used to compensate for laser-to-laser output power differences. Laser calibration procedures are also employed in the data recording art, such as for writing digital data onto optical disks. As some examples, U.S. Pat. No. 5,687,156 (Hurst, Fr.), U.S. Pat. No. 5,185,733 (Finkelstein, et al.), and U.S. Pat. No. 5,216,659 (Call et al.) disclose techniques used to calibrate lasers in optical disk writing. However, for purposes of recording digital data, represented in sequences of binary 1/0 data, only two discrete levels of laser power are needed. In contrast, when writing image data using a device such as is disclosed in the Harshbarger et al. patent, output laser power is related to achievable density, so that power must be accurately adjustable over a range, wherein each discrete value within the range can be correlated to corresponding density of donor colorant transferred to the receiver. Even when applying or withholding only one level of laser power to expose a halftone image on an image-recording material whose image density varies with exposure, that applied power level must be set accurately to the intended value in order to render the image with fidelity.

There are detailed calibration procedures developed to systematically adjust the power output of each laser in order to minimize banding and related anomalies. U.S. Pat. Nos. 5,921,221 and 5,323,179, Sanger et al., disclose use of a calibration station and sensor for laser calibration in a multichannel printer. The method disclosed in the Sanger et al. patents involves both direct measurement of laser power and measurement of densities for colorant output on a receiver medium. From the detailed description of the laser calibration process, it is clear that it would be advantageous to eliminate steps in the overall calibration procedure to simplify this procedure where possible.

While such methods developed for power calibration compensate for differences in laser output power, there is room for improvement. It has been observed that even if two writing lasers are very closely matched in terms of measured output power, the lasers may yet achieve different efficiencies in donor colorant transfer. It is known that the donor colorant exhibits more efficient transfer for some wavelengths of the light source than for others. Moreover, while each writing laser in the array is manufactured to emit wavelengths within a narrow range, there are differences in laser fabrication that result in diode lasers having slightly different wavelengths. For example, while the specified wavelength of each laser in an array may be 840 nm, nominal, the actual wavelengths obtained may range from 832 nm to 846 nm. It is known that each diode laser provides the substantial portion of its output within a narrow 1 nm band. Alternatives to compensate for wavelength effects, such as manufacturing diode lasers to within tighter wavelength tolerances or manufacturing a donor colorant medium that is less wavelength-dependent are very costly.

There are methods for tuning some types of lasers to adjust frequency, thereby adjusting laser output wavelength. As one example, U.S. Pat. No. 5,033,114, Jayaraman et al., discloses a tunable laser used in data communications. A feedback control loop for an optogalvanic glow-discharge modulator comprises beamsplitters and detectors used to control modulation of the output laser to achieve a desired wavelength. As part of the feedback loop, an interference filter is used to select that portion of the sensed feedback signal that is needed to achieve output frequency and wavelength tuning. These tuning procedures are not applicable to diode lasers, however, and maintenance of all emission at a specific wavelength is not required for the type of image-recording material used in imaging applications.

Interference filters have been used as part of a calibration feedback loop for laser frequency tuning control, as disclosed in the Jayaraman et al. patent noted above. Interference filters have also been used to isolate specific wavelength components of a sensor signal, such as is disclosed in U.S. Pat. No. 5,275,327, Watkins et al., for laser-based sensing during an arc welding operation. Interference filter transmission profiles have been adapted to isolate specific wavelengths for measurement by a sensor, but without adaptation to a response profile of an imaging medium.

As a result of wavelength dependence, an operator calibrating a printhead may be required to measure laser wavelength for each diode laser in an array and to compensate by making power adjustments corresponding to each wavelength. Alternatively, an operator may be forced to perform additional cycles of calibration, preparation, and measurement procedures, such as manually adjusting power output to achieve uniform density response. A radiation source may also change the wavelength distribution of its emitted power during exposure of an image, so that a suitably prepared feedback-power-controller would be desirable to maintain constant deposited energy in the image-recording medium. Thus, there is a need for a simple and inexpensive solution that allows a calibration procedure to adjust lasers for output power for a wavelength-sensitive image recording material.

There is a need for a printer having a calibration apparatus and method that accommodates differences in laser output wavelength and compensates for these differences in a manner corresponding to variability in wavelength-sensitive response of the image-recording medium.

SUMMARY OF THE INVENTION

It is an object of the present invention to provide a printhead that is adapted to the wavelength-dependent response of an exposure-sensitive image recording medium.

It is another object of the present invention to simultaneously equalize the colorant transfer by all of the sources in a multiple-source printhead regardless of the distribution of wavelengths emitted by any single source or of the disparity among wavelengths emitted by different sources in the same printhead.

It is a further object of the present invention to adjust the output power of a printhead during printing and employ a feedback loop to maintain constant energy deposition in the exposure-sensitive medium if the distribution of emitted wavelengths changes.

According to one aspect of the present invention calibration station for a printhead adapted to provide a beam of electromagnetic radiation from a variable electromagnetic energy source onto a sensitive radiation medium, the calibration station incorporating a sensor disposed for sensing the beam provided by the printhead, wherein the sensor provides an output sensor signal indicative of the sensed power of the beam. A control circuit is adapted to accept the output sensor signal from the sensor and adjusts the variable electromagnetic energy source. A filter is disposed in the path of the beam between the printhead and sensor, adapted to transmit to the sensor a portion of incident electromagnetic radiation over a predefined range of wavelengths, dependent upon a measured response characteristic of the radiation-sensitive medium.

According to one embodiment of the present invention, a printhead for an image producing apparatus applies a level of light energy to generate an image by transferring a donor colorant from a donor medium onto a receiver medium. A calibration apparatus allows measurement of light energy output. A control apparatus adjusts effective output light energy based on the measurement obtained. In a preferred embodiment, the printhead uses a plurality of lasers arranged in an array. Each laser output power can be separately adjusted in order to equalize the output power of the array.

A feature of the present invention is the design of a transmission profile for the optically absorptive filter or interference filter that compensates for wavelength-dependent sensitivity of an imaging medium. The absorptive filter having these characteristics thereby enables the accurate adjustment of each one of a plurality of light sources, in which each light source may emit light at a separate wavelength, such that adjusting each light source results in achieving uniform light energy absorbed by the portion of the imaging medium responsive to the exposing radiation.

An advantage of the present invention is that it allows a calibration procedure to measure the output power delivered by a light source at a specific wavelength in proportion to the effectiveness of output power at that specific wavelength, preferably summed over a range of wavelengths. As a result, an operator calibrating the printhead output power need not be concerned with wavelength differences between individual light sources.

Another advantage of the present invention is that it can be applied for reducing the overall amount of calibration work and time required by a technician when an imaging apparatus is first manufactured, or at any subsequent occasion, such as when a laser is replaced.

A further advantage of the present invention is that it can be employed in conjunction with a printhead-power feedback-control loop during the course of printing to maintain constant energy deposition in the exposure-sensitive image recording medium if the distribution of emitted wavelengths change.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 1:
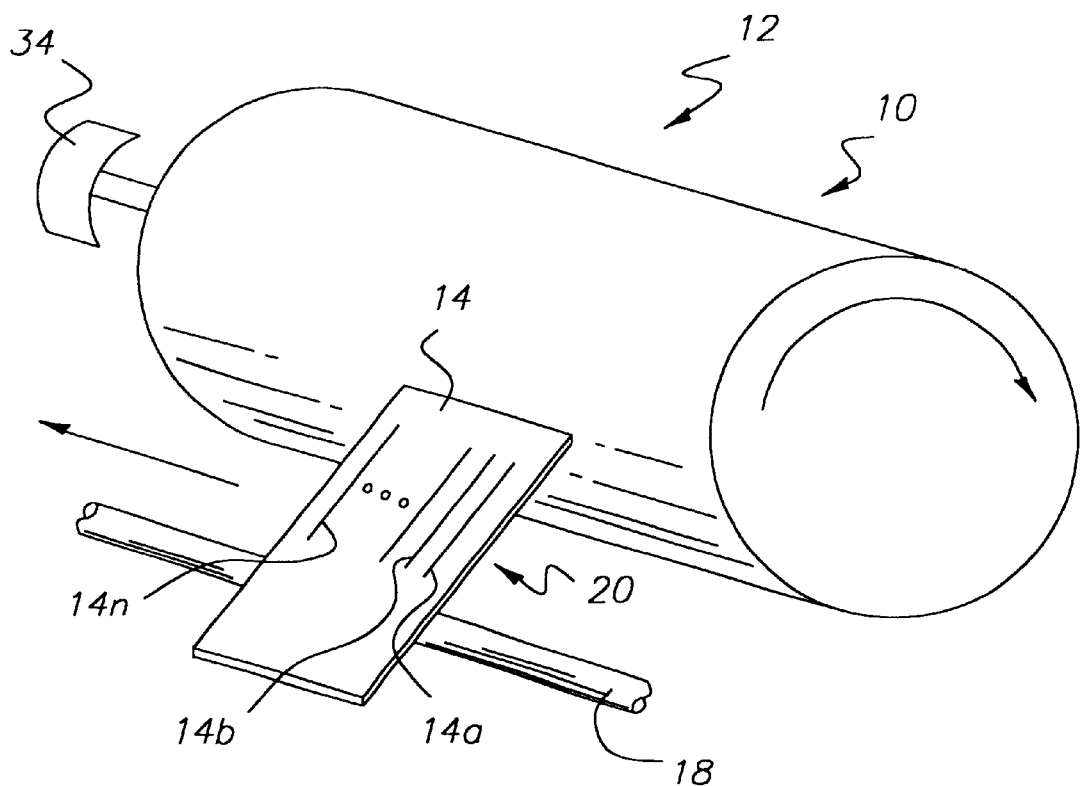
FIG. 1 is a schematic view of a printhead and imaging drum in a multichannel image producing apparatus.

Referring to FIG. 1 there is shown a printhead 20 movably supported adjacent an imaging drum 12 in an image producing apparatus 10. A lead screw 18 rotates to move printhead 20 in a direction parallel to the imaging drum 12 axis as imaging drum 12 rotates. Printhead 20 comprises a light source array 14 consisting of a plurality of light sources, with individual light sources 14a, 14b, and 14n listed and shown in FIG. 1. It is to be understood that light source array 14 can have one or more light sources 14a, 14b, and 14n. In a preferred embodiment, for example, printhead 20 comprises an array 14 having 28 individual light sources 14a, 14b, and 14n. The light sources may be comprised of LEDs, x-ray emitters, incandescent lamps, arc lamps, or other sources of radiation as is well known in the art.

A calibration station 34 is disposed to one side of imaging drum 12. For existing image producing apparatus 10, calibration station 34 comprises components used for measuring output power, shown in a schematic block diagram in FIG. 2. A calibration control loop 30 is formed for calibration of output power for a beam of light from each light source 14a, 14b, and 14n. In the embodiment shown in FIG. 2, a diode laser 36a provides the output power to be calibrated for light source 14a. There is one diode laser 36a, 36b, and 36n supplying light power for each light source 14a, 14b, and 14n. Light from diode laser 36a is directed to array 14 on printhead 20 by an optical fiber 38. Printhead 20 optics direct a beam 16 of light energy from light source 14a onto a sensor 26. Sensor 26 is a photodiode, as is well known in the light sensing art.

An optical attenuator 28 is used in the path of beam 16 to reduce the power level for sensing in order to avoid damaging or saturating the sensor with high light powers available from some radiation sources. Optical attenuator 28 is, for example, a filter, a scattering medium, or some other material known in the optics art to provide a uniform, wavelength-independent attenuation or dispersal of the light from printhead 20.

Sensor 26 provides an output feedback signal 24 that exhibits a signal level indicative of the relative amount of power sensed from beam 16. Sensor output is typically a change in current which is proportional to a change in laser power level. A laser control circuit 32, in turn, senses feedback signal 24 obtained for a known level of input power provided to laser 36a. Preprogrammed logic in laser control circuit 32 uses calibration control loop 30 to measure beam 16 output power levels from beam 16 elicited by a number of known input power levels provided to laser 36a. A control logic processor 40 stores the resulting measurements of feedback signal 24 as part of calibration data for light source 14a.

Control logic processor 40 is typically a computer that also controls other functions of the image producing apparatus. Components used for optical attenuator 28, sensor 26, laser control circuit 32, and diode laser 36a can be selected from a number of conventional components, well known in the laser imaging art. Laser control circuit 32 can control laser power by providing a constant-current source, as is disclosed in U.S. Pat. No. 5,966,394 (Spurr, et al.) Techniques such as pulse-width modulation or drive current adjustment can be used to modulate laser power, as is known in the laser power control art.

Figure 3:
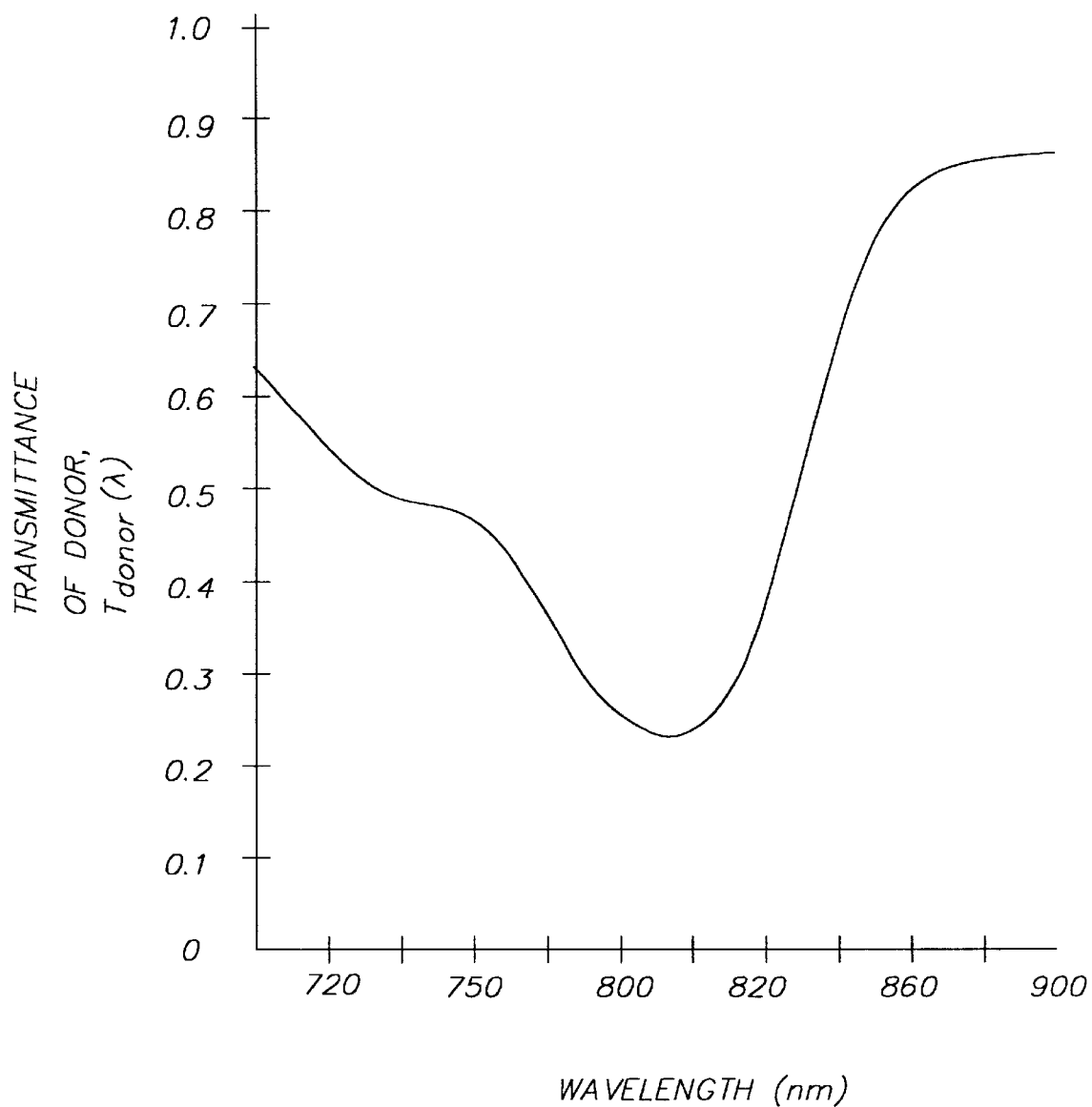
FIG. 3 is a graph showing a transmittance spectrum of a donor medium used in an image producing apparatus.

Referring to FIG. 3 there is shown a graph of a transmittance spectrum $T_{donor}[\lambda]$ for a donor medium used with printhead 20. As the graph of FIG. 3 shows, there is a pronounced wavelength dependency for depositing energy from the light beam in the donor. For example, approximately 72% of an amount of light energy applied with a wavelength of 850 nm is transmitted by the donor. By comparison, only 24% of that same amount of light energy, having a wavelength of 800 nm, is transmitted.

Figure 2:
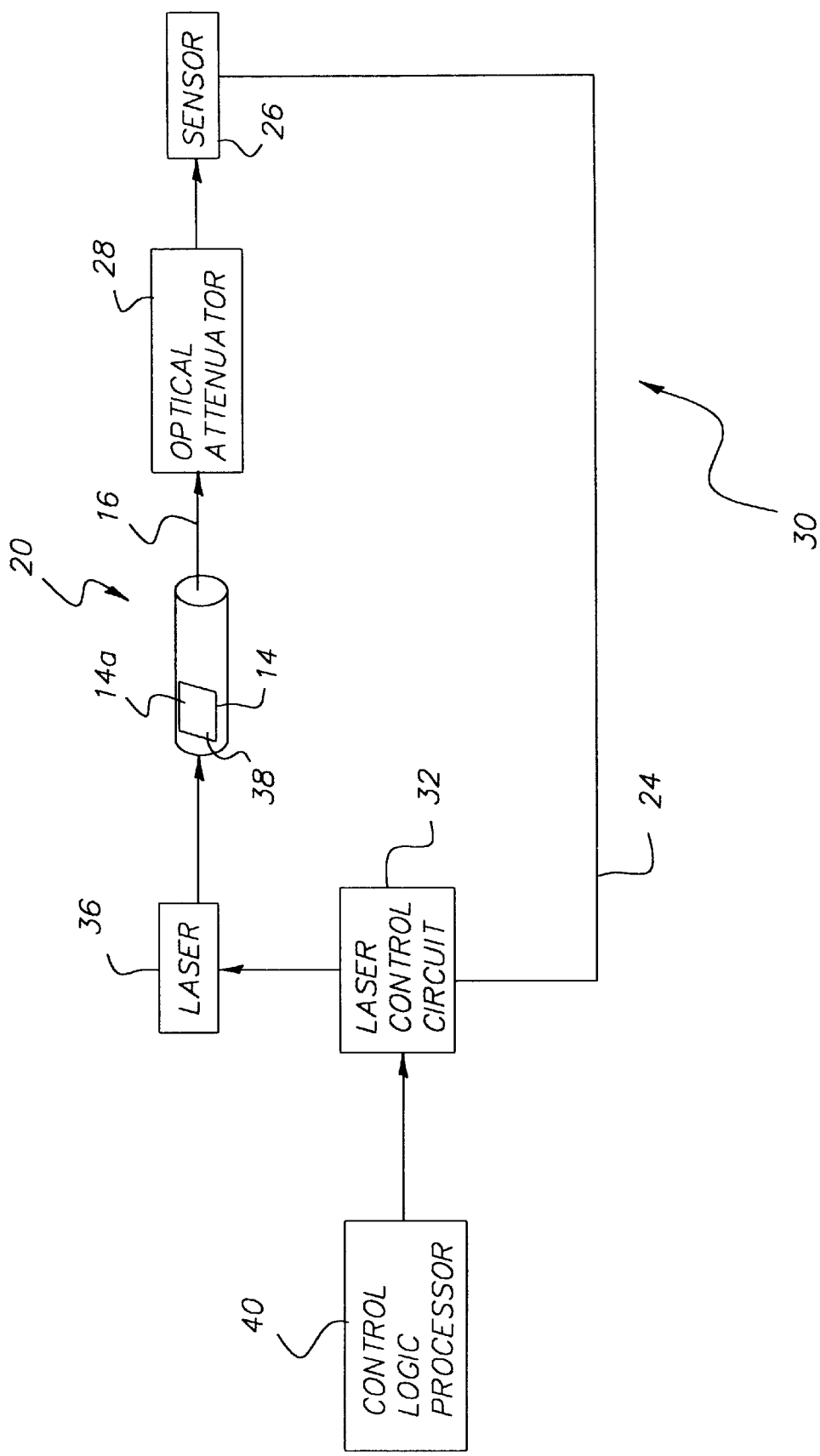
FIG. 2 is a representative block diagram of the printhead calibration control loop used in a prior art multichannel image producing apparatus.

The relationships graphed in FIG. 3 suggest how problems can arise when attempting to obtain balanced output laser power using the prior art printhead calibration components shown in FIG. 2. A diode laser 36 of the type that is commonly used for imaging apparatus disclosed in the Harshbarger, et al. patent noted hereinabove, has an emission wavelength, $\lambda_{laser}$, in the range: 800 nm$<\lambda_{laser}<$850 nm. The diode laser 36 bandwidth is narrow, typically less than 1 nm. It is possible that two diode lasers 36a and 36b that serve as two of light sources 14a and 14b in array 14 can each emit light beam 16 at the same output power but at two different wavelengths in the 800–850 nm region. The resulting output power from diode laser 36a may have a different effect on the donor medium than does the same mesurable output power from diode laser 36b. As a result, banding or other image anomalies can occur.

Table 1 lists, for selected wavelengths, actual numerical values obtained from measurements of the transmittance of the donor.

TABLE 1

Representative Transmittance Values for a Donor

| $\lambda$, Wavelength (nm) | T, Transmittance |
|---|---|
| 790 | 0.246 |
| 792 | 0.257 |
| 794 | 0.250 |
| 796 | 0.244 |
| 798 | 0.239 |
| 800 | 0.237 |
| 802 | 0.235 |
| 804 | 0.236 |
| 806 | 0.238 |
| 808 | 0.242 |
| 810 | 0.247 |
| 812 | 0.254 |
| 814 | 0.263 |
| 816 | 0.274 |
| 818 | 0.287 |
| 820 | 0.303 |
| 822 | 0.321 |
| 824 | 0.342 |
| 826 | 0.364 |
| 828 | 0.389 |
| 830 | 0.417 |
| 832 | 0.446 |
| 834 | 0.478 |
| 836 | 0.509 |
| 838 | 0.542 |
| 840 | 0.574 |
| 842 | 0.607 |

TABLE 1-continued

Representative Transmittance Values for a Donor

| λ, Wavelength (nm) | T, Transmittance |
| --- | --- |
| 844 | 0.637 |
| 846 | 0.666 |
| 848 | 0.693 |
| 850 | 0.718 |
| 852 | 0.740 |
| 854 | 0.760 |
| 856 | 0.777 |
| 858 | 0.792 |
| 860 | 0.804 |

The light energy at a single wavelength incident on the donor is disposed of in one of three ways.

1) the fraction R, called "reflectance", of the incident light is reflected or scattered back into the half-space on the side of the donor upon which the light was incident;

2) the fraction T, called "transmittance", of the incident light is transmitted into the half-space on the side of the donor opposite the side upon which the light was incident;

3) the fraction A, called "absorptance", of the incident light is absorbed in the interior of the donor.

For illumination and detection at the same wavelength in order to avoid observation of any absorbed light as fluorescence or phosphorescence at another wavelength, these fractions sum to unity for each wavelength:

$$1 = R[\lambda] + A[\lambda] + T[\lambda] \qquad (1)$$

Figure 4:
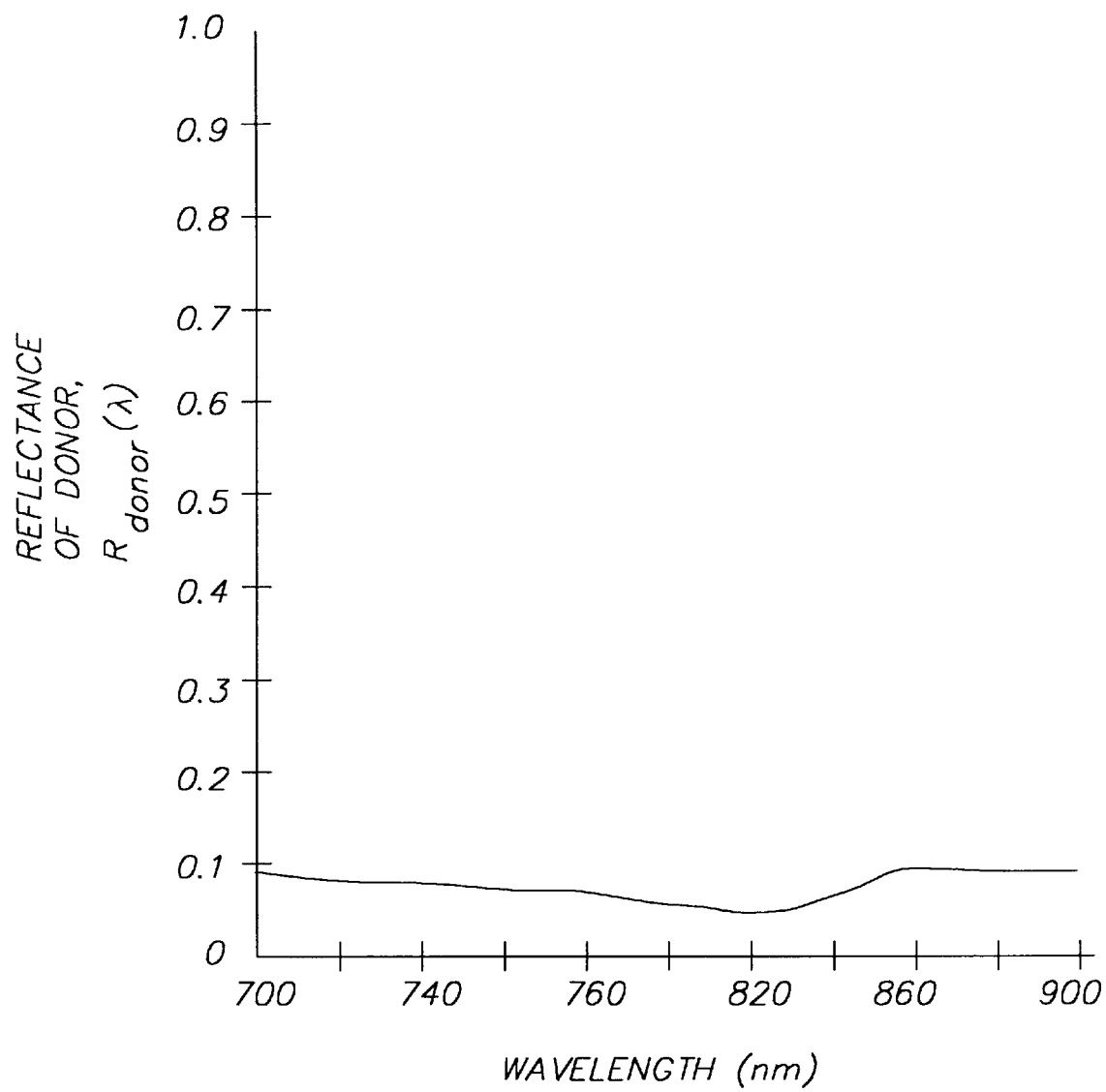
FIG. 4 is a graph showing the corresponding reflectance spectrum for the donor medium of FIG. 3.

The donor in this embodiment comprises a clear support coated with a colorant layer. FIG. 4 shows a graph of the reflectance spectrum $R_{donor}[\lambda]$ for the donor medium with its clear support facing the spectrophotometer light source, similar to the donor orientation when used with printhead 20. The absorptance spectrum $A_{donor}[\lambda]$ of the donor in FIG. 5 is computed from the transmittance spectrum in FIG. 3 and the reflectance spectrum in FIG. 4 using equation 1.

The donor absorptance is the sum of the absorptances of the clear support and of the colorant layer:

$$A_{donor}[\lambda] = A_{support}[\lambda] + A_{colorant}[\lambda] \qquad (2)$$

Figure 5:
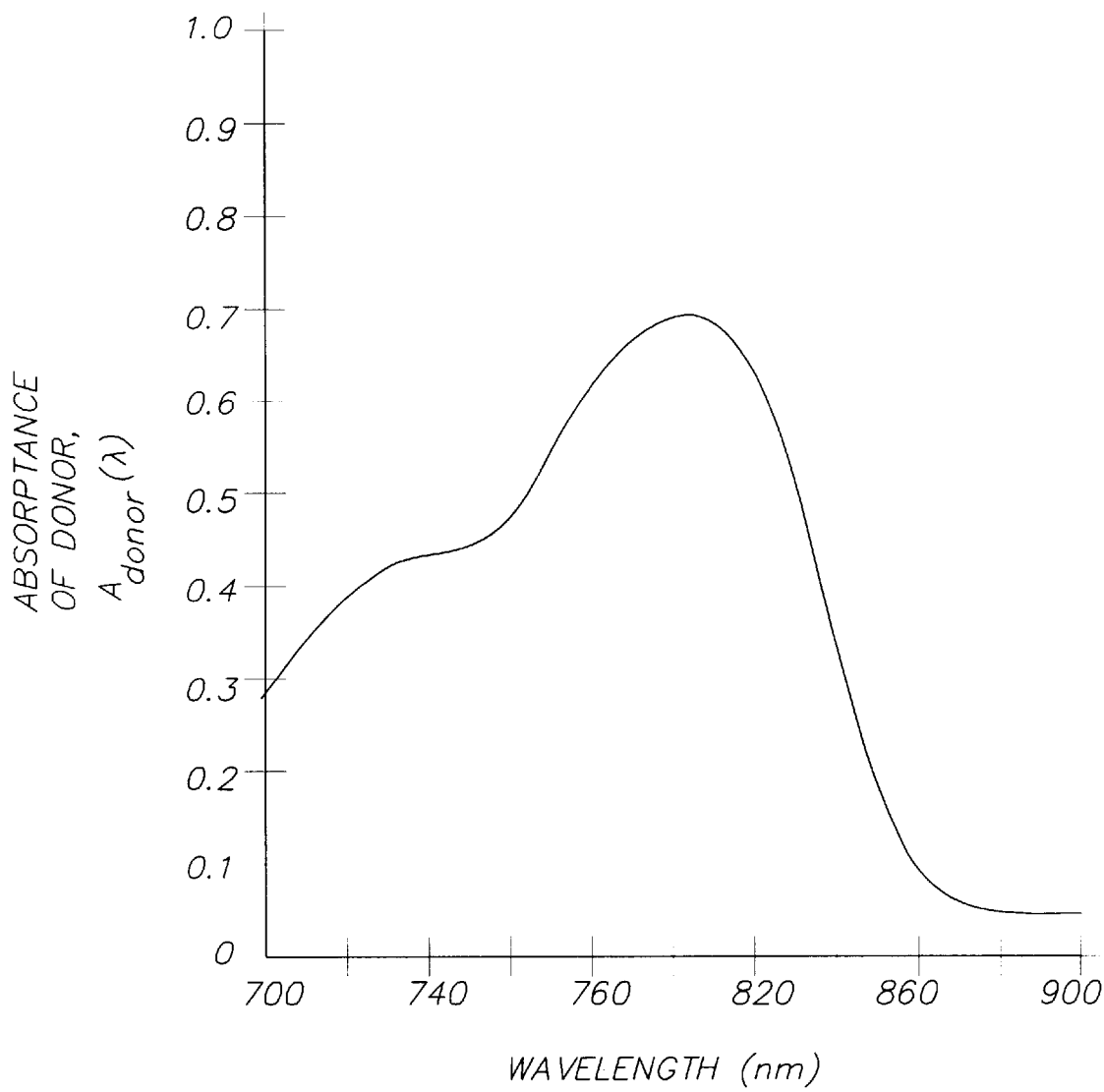
FIG. 5 is a graph showing the corresponding absorptance spectrum for the donor medium of FIG. 3.
Figure 6:
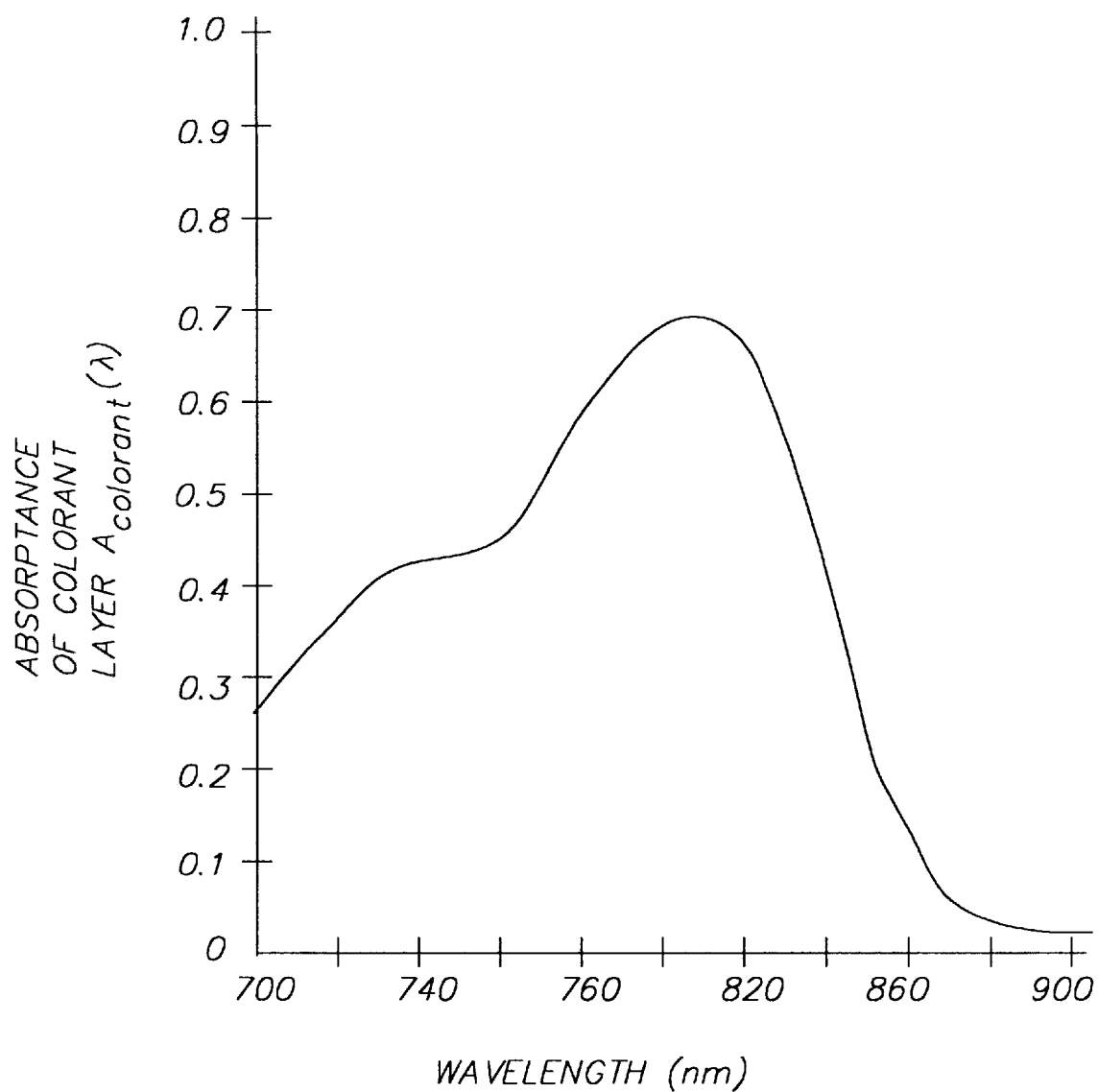
FIG. 6 is a graph showing the absorptance of the coated colorant layer of the donor of FIG. 3, which is the fraction of incident light power that is converted to heat in that colorant layer, as this value varies over the light spectrum.

The absorptance of the colorant layer alone in FIG. 6 is inferred from the absorptance in FIG. 5 for the donor corrected by recourse to equation (2) for the less than 1% absorptance of the clear support throughout the spectral range plotted in FIGS. 5 and 6.

The light energy $P_{colorant}[\lambda_{laser}]$ effective in producing the image by the laser power $P_{laser}[\lambda_{laser}]$ is the fraction of light passing through the clear support and entering the colorant layer but not exiting the far side of the donor nor reflected from interfaces between the colorant layer and either the support or air, computed by the following equation (3).

$$P_{colorant}[\lambda_{laser}] = P_{laser}[\lambda_{laser}] \times A_{colorant}[\lambda_{laser}] \qquad (3)$$

This colorant layer constitutes the exposure-sensitive image recording medium of the donor in this example. FIG. 6 graphs the fraction of light absorbed in the donor to be turned into heat for transferring colorant, for each wavelength $\lambda_{laser}$. Lasers emitting different wavelengths of light $\lambda_{laser1}$ and $\lambda_{laser2}$ must be adjusted to different power levels in order to deposit the same power $P_{colorant,goal}$ inside the donor colorant layer in order to minimize printing artifacts, as in the following equations(4, 5):

$$P_{laser1}[\lambda_{laser1}] = \frac{P_{colorant,goal}}{A_{colorant}[\lambda_{laser1}]} \quad \text{and} \qquad (4)$$

$$P_{laser2}[\lambda_{laser2}] = \frac{P_{colorant,goal}}{A_{colorant}[\lambda_{laser2}]} \qquad (5)$$

Figure 10:
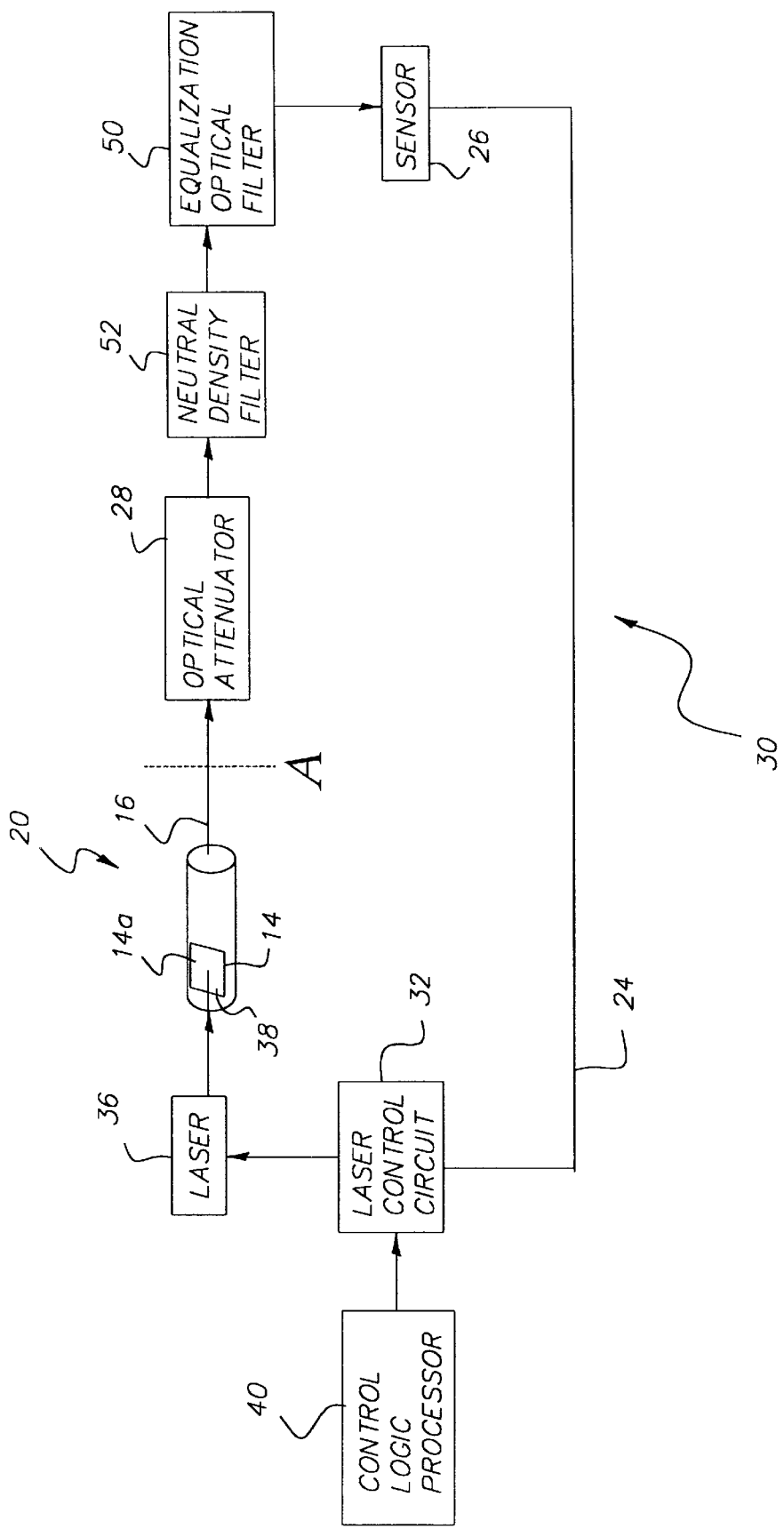
FIG. 10 is a schematic view of the printhead calibration control loop of the present invention.

Equations (4) and (5) indicate that the power of each diode laser 36a/b/n should be adjusted inversely to the quantity in FIG. 6, $A_{colorant}[\lambda_{laser}]$, determined by the absorptance of the donor's colorant layer at the emitted wavelength of diode laser 36a, 36b, and 36n. The present invention provides this adjustment by disposing an equalization optical filter 50 in calibration control loop 30, as is shown in FIG. 10. Equalization optical filter 50 can be positioned between optical attenuator 28 and sensor 26, as shown in FIG. 10. Alternately, equalization optical filter 50 can be placed before optical attenuator 28, as indicated by dotted line A in FIG. 10. Or, the functions of optical filter 50 and optical attenuator 28 can be combined in a single component that provides both attenuation and transmissive filter function for beam 16. Equalization optical filter 50 is an absorptive filter in a preferred embodiment of the present invention. It should be noted, however, that equalization optical filter 50 could alternately be an interference filter.

Spectral Shape of Equalization Optical Filter 50

The spectral shape $T_{filter}[\lambda_{laser}]$ of equalization optical filter 50 is designed to compensate for individual differences in wavelength $\lambda_{laser}$ between diode lasers 36a/b/n. Referring again to FIG. 10, it can be seen that proper design of the spectral shape $T_{filter}[\lambda_{laser}]$ of equalization optical filter 50 causes sensor 26 to indicate the amount of energy that will actually be deposited in the donor by diode laser 36a, 36b, and 36n, regardless of the specific wavelength of diode laser 36a, 36b, and 36n.

The power observed by equalization optical filter 50 sensor 26 combination for any diode laser 36 a, 36b, and 36n is given by the following equation (6):

$$P_{sensor}[\lambda_{laser}] = P_{laser}[\lambda_{laser}] \times T_{filter}[\lambda_{laser}] \qquad (6)$$

In order to keep the signal constant for equal-energy-depositing diode lasers 36a, 36b, and 36n, the appropriate transmittance profile of equalization optical filter 50 must obey the relation given in the following equation (7):

$$P_{laser1}[\lambda_{laser1}] \times T_{filter}[\lambda_{laser1}] = P_{sensor,goal} = P_{laser2}[\lambda^{laser2}] \times T_{filter}[\lambda_{laser2}] \qquad (7)$$

Recall that equations (4) and (5) implied that the diode lasers 36a, 36b, and 36n should be adjusted for matching energy deposition in the donor, as represented in the following equation (8):

$$P_{laser1}[\lambda_{laser1}] \times A_{colorant}[\lambda_{laser1}] = P_{laser2}[\lambda_{laser2}] \times A_{colorant}[\lambda_{laser2}] \qquad (8)$$

The requirements of equations (7) and (8) can be met simultaneously if equalization optical filter 50 has a transmittance profile as characterized by the following equation (9):

$$T_{filter}[\lambda] = A_{colorant}[\lambda] \frac{P_{sensor,goal}}{P_{colorant,goal}} \qquad (9)$$

Equation (9) indicates that the transmittance profile of equalization optical filter 50 should be the donor's absorptance multiplied by an arbitrary constant depending upon the maximum power available from diode lasers 36a, 36b, and 36n and also depending upon the level of output feedback signal 24 (FIG. 10) desired from sensor 26 during calibration. In other words, the shape of the transmittance spectrum of equalization optical filter 50 is given by the absorptance spectrum of the donor to within a vertical scale factor. Of course, the highest value in the transmittance profile of filter 50 must be smaller than 1 in order to be feasible. Since the absorptance of a donor's colorant layer may not be generally linear in either colorant concentration or colorant-layer thickness, change in either thickness or concentration of the colorant layer would require adjustment of filter 50 profile if a perfect match were desired for the energy deposited at all diode laser 36a, 36b, and 36n emission wavelengths. The appropriate filter matched to the image-recording medium to be exposed by the printer might be selected from among a bank of filters 50 in the calibration station in accordance with information communicated to the printer from an "Intelligent Media" encoded chip mounted on the packaging of that image-recording medium.

Figure 7:
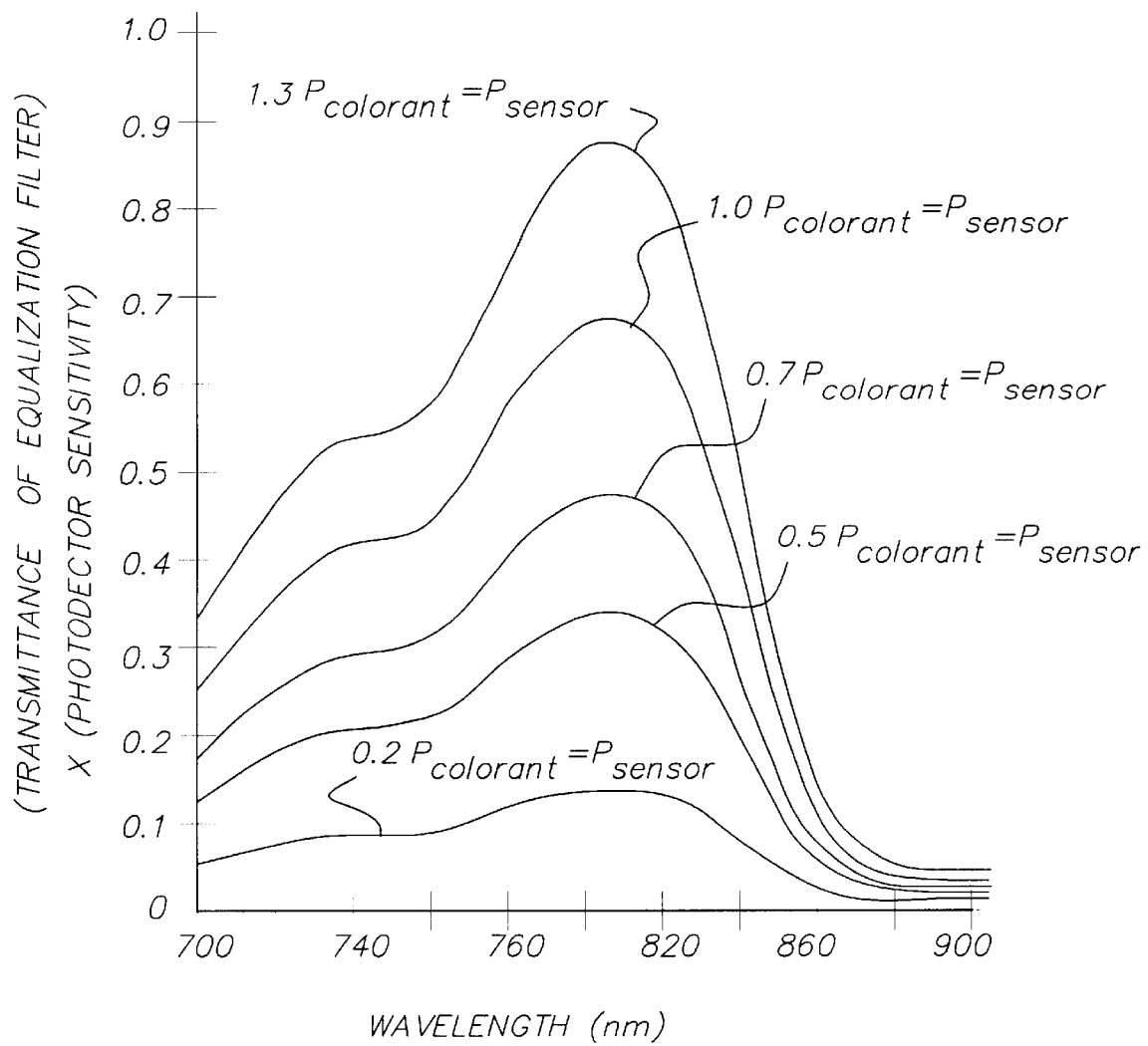
FIG. 7 is a graph showing a family of equalization optical filter transmittance profiles for the present invention.
Figure 8:
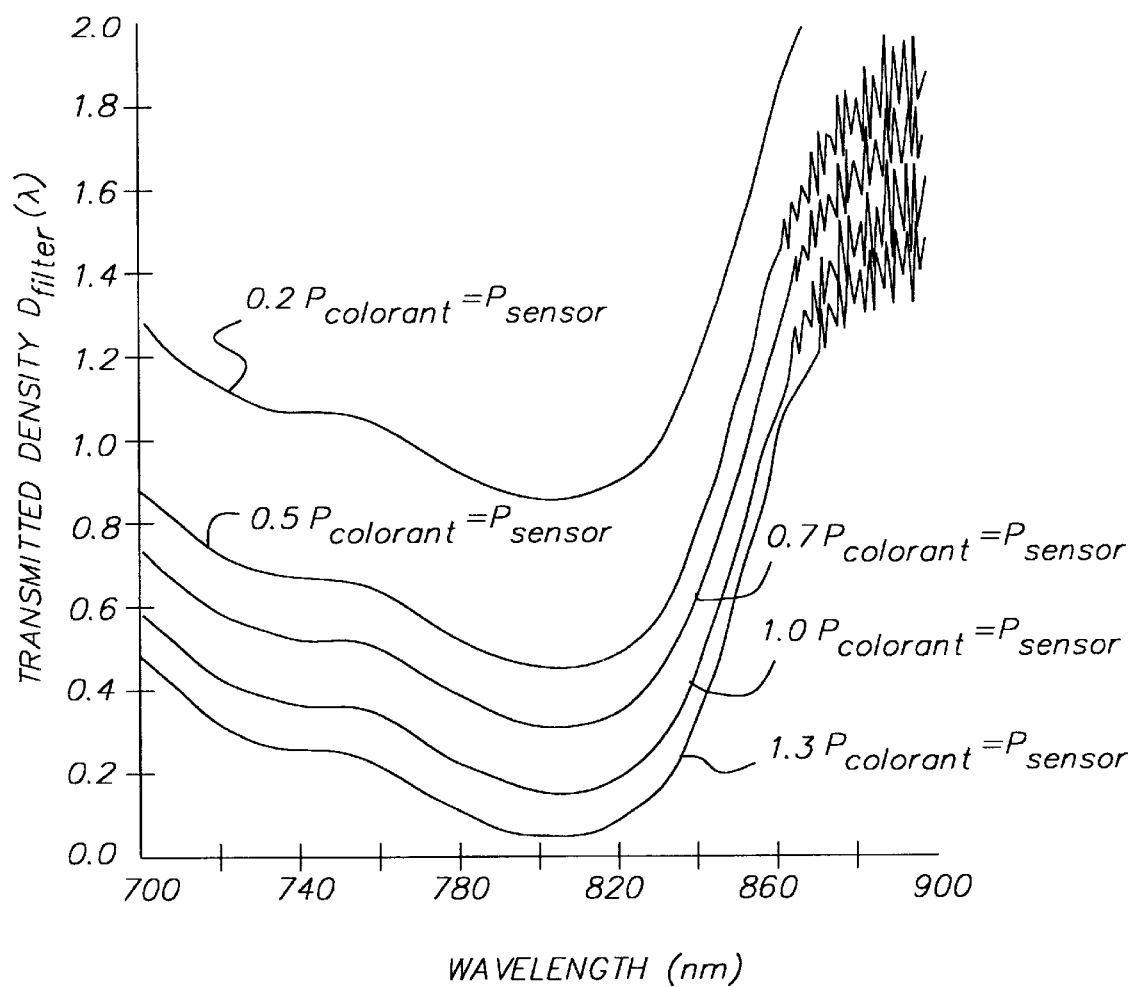
FIG. 8 is a graph showing a family of transmitted-density profiles for an optical filter, corresponding to the transmittance profiles of FIG. 7.

Referring to FIG. 7 there is shown a family of transmittance spectra for equalization optical filter 50 that would each produce constant sensor 26 signals for equal-energy-depositing diode lasers 36a, 36b, and 36n. Referring to FIG. 8 there is shown a family of appropriate transmitted-density profiles for equalization optical filter 50 computed from the transmittance spectrum of the donor by inverting the transmittance-density relationship of equation (10) for the curves of FIG. 7:

$$T[\lambda] = 10^{-D[\lambda]} \quad (10)$$

The arbitrary vertical scale for the transmittance spectra is equivalent to an arbitrary vertical offset in the transmitted-density spectra. This implies that an auxiliary neutral-density filter 52 (FIG. 10) could be added to calibration control loop 30 or that neutral filter characteristics could alternatively be added to equalization optical filter 50.

Table 2 presents two possibilities for acceptable equalization optical filter 50 transmittances and transmitted densities corresponding to the $\{P_{sensor,goal} = P_{colorant,goal}\}$ case and to $\{P_{sensor,goal} = 1/2 P_{colorant,goal}\}$ case. Table 3 verifies the adjustments by comparing one diode laser 36a/b/n emitting [$\lambda_{laser1}$=810 nm] with another diode laser 36a/b/n emitting [$\lambda_{laser2}$=840 nm].

The spectral characteristics of equalization optical filter 50 can also be adjusted to compensate for variations in sensitivity of sensor 26 with wavelength. For example, in a preferred embodiment, using a photodiode for sensor 26 function, it has been determined that $S_{sensor}[\lambda]$ response of the photodiode's signal $F_{sensor}[\lambda]$ to source power increases linearly with wavelength over the 790–860 nm range. In order to maintain the feedback signal $F_{sensor}[\lambda]$ constant when the power deposited in the donor colorant is constant, equations (3) and (8) combined with a generalization of equation (7):

$$P_{laser1}[\lambda_{laser1}] \times T_{filter}[\lambda_{laser1}] \times S_{sensor}[\lambda_{laser1}] = F_{sensor,goal} = P_{laser2}[\lambda_{laser2}] \times T_{filter}[\lambda_{laser2}] \times S_{sensor}[\lambda_{laser2}] \quad (11)$$

indicates that the transmittance of the equalization filter should be designed so that $$T_{filter}[\lambda] = \frac{A_{colorant}[\lambda]}{S_{sensor}[\lambda]} \frac{F_{sensor,goal}}{P_{colorant,goal}} \quad (12)$$

in analogy with equation 9. To compensate for this increased photodiode sensitivity, equalization-optical-filter transmittance should decrease a further 8% with the reciprocal of wavelength from 790 nm to 860 nm.

Figure 9:
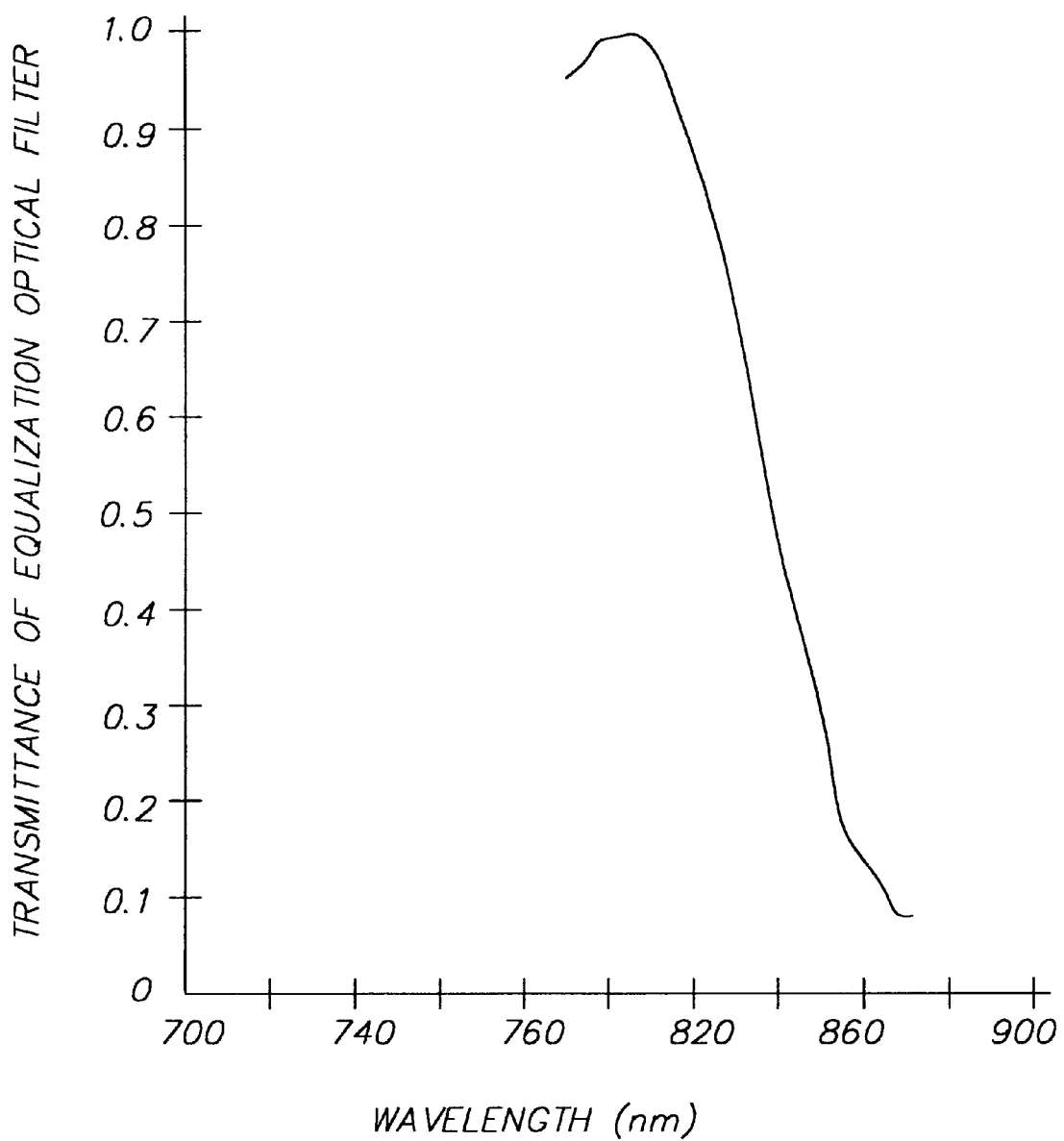
FIG. 9 is a graph showing a portion of an equalization optical filter transmittance profile of FIG. 7, normalized to unity at its peak value and adapted to compensate for photosensor sensitivity characteristics.

A cumulative transmittance profile of equalization optical filter 50 with its highest value at 803 nm normalized to unity, and with compensation for wavelength dependence of sensor 26, is presented in Table 4. FIG. 9 shows the optical filter transmittance profile normalized to unity at 803 nm and compensated for sensor 26 wavelength dependence.

TABLE 2

Representative Transmittances and Transmitted Densities for Equalization Optical Filter 50 with Wavelength-Independent Photodetector

| λ, Wavelength (nm) | D, Transmitted Density | T, Transmittance = $10^{(-D)}$ |
|---|---|---|
| Equalization Optical Filter Profile for $P_{sensor,goal} = P_{colorant,goal}$ | | |
| 790 | 0.179 | 0.663 |
| 791 | 0.177 | 0.666 |
| 792 | 0.173 | 0.671 |
| 793 | 0.171 | 0.675 |
| 794 | 0.168 | 0.680 |
| 795 | 0.166 | 0.683 |
| 796 | 0.164 | 0.686 |
| 797 | 0.161 | 0.690 |
| 798 | 0.160 | 0.692 |
| 799 | 0.158 | 0.694 |
| 800 | 0.157 | 0.696 |
| 801 | 0.156 | 0.697 |
| 802 | 0.156 | 0.698 |
| 803 | 0.155 | 0.700 |
| 804 | 0.155 | 0.700 |
| 805 | 0.155 | 0.700 |
| 806 | 0.156 | 0.699 |
| 807 | 0.156 | 0.698 |
| 808 | 0.157 | 0.696 |
| 809 | 0.159 | 0.694 |
| 810 | 0.160 | 0.692 |
| 811 | 0.161 | 0.690 |
| 812 | 0.163 | 0.686 |
| 813 | 0.166 | 0.682 |
| 814 | 0.169 | 0.678 |
| 815 | 0.173 | 0.672 |
| 816 | 0.176 | 0.667 |
| 817 | 0.181 | 0.659 |
| 818 | 0.184 | 0.655 |
| 819 | 0.190 | 0.645 |
| 820 | 0.194 | 0.640 |
| 821 | 0.202 | 0.628 |
| 822 | 0.207 | 0.622 |
| 823 | 0.217 | 0.607 |
| 824 | 0.222 | 0.600 |
| 825 | 0.233 | 0.585 |
| 826 | 0.239 | 0.577 |
| 827 | 0.253 | 0.559 |
| 828 | 0.259 | 0.551 |
| 829 | 0.275 | 0.531 |
| 830 | 0.282 | 0.522 |
| 831 | 0.301 | 0.499 |
| 832 | 0.310 | 0.490 |
| 833 | 0.331 | 0.466 |
| 834 | 0.341 | 0.456 |
| 835 | 0.363 | 0.433 |
| 836 | 0.378 | 0.419 |
| 837 | 0.399 | 0.399 |

TABLE 2-continued

Representative Transmittances and Transmitted Densities for Equalization Optical Filter 50 with Wavelength-Independent Photodetector

| $\lambda$, Wavelength (nm) | D, Transmitted Density | T, Transmittance = $10^{(-D)}$ |
|---|---|---|
| 838 | 0.419 | 0.381 |
| 839 | 0.438 | 0.365 |
| 840 | 0.465 | 0.343 |
| 841 | 0.481 | 0.330 |
| 842 | 0.515 | 0.305 |
| 843 | 0.528 | 0.297 |
| 844 | 0.569 | 0.270 |
| 845 | 0.579 | 0.264 |
| 846 | 0.624 | 0.238 |
| 847 | 0.636 | 0.231 |
| 848 | 0.679 | 0.209 |
| 849 | 0.699 | 0.200 |
| 850 | 0.735 | 0.184 |
| 851 | 0.767 | 0.171 |
| 852 | 0.788 | 0.163 |
| 853 | 0.841 | 0.144 |
| 854 | 0.841 | 0.144 |
| 855 | 0.912 | 0.123 |
| 856 | 0.900 | 0.126 |
| 857 | 0.974 | 0.106 |
| 858 | 0.974 | 0.106 |
| 859 | 1.022 | 0.095 |
| 860 | 1.054 | 0.088 |

Equalization Optical Filter Profile for $P_{sensor,goal} = 0.5 \times P_{colorant,goal}$

| $\lambda$, Wavelength (nm) | D, Transmitted Density | T, Transmittance = $10^{(-D)}$ |
|---|---|---|
| 790 | 0.480 | 0.331 |
| 791 | 0.478 | 0.333 |
| 792 | 0.474 | 0.336 |
| 793 | 0.472 | 0.337 |
| 794 | 0.469 | 0.340 |
| 795 | 0.467 | 0.341 |
| 796 | 0.465 | 0.343 |
| 797 | 0.462 | 0.345 |
| 798 | 0.461 | 0.346 |
| 799 | 0.459 | 0.347 |
| 800 | 0.458 | 0.348 |
| 801 | 0.457 | 0.349 |
| 802 | 0.457 | 0.349 |
| 803 | 0.456 | 0.350 |
| 804 | 0.456 | 0.350 |
| 805 | 0.456 | 0.350 |
| 806 | 0.457 | 0.349 |
| 807 | 0.457 | 0.349 |
| 808 | 0.458 | 0.348 |
| 809 | 0.460 | 0.347 |
| 810 | 0.461 | 0.346 |
| 811 | 0.462 | 0.345 |
| 812 | 0.465 | 0.343 |
| 813 | 0.467 | 0.341 |
| 814 | 0.470 | 0.339 |
| 815 | 0.474 | 0.336 |
| 816 | 0.477 | 0.334 |
| 817 | 0.482 | 0.330 |
| 818 | 0.485 | 0.327 |
| 819 | 0.491 | 0.323 |
| 820 | 0.495 | 0.320 |
| 821 | 0.503 | 0.314 |
| 822 | 0.508 | 0.311 |
| 823 | 0.518 | 0.304 |
| 824 | 0.523 | 0.300 |
| 825 | 0.534 | 0.292 |
| 826 | 0.540 | 0.289 |
| 827 | 0.554 | 0.279 |
| 828 | 0.560 | 0.276 |
| 829 | 0.576 | 0.265 |
| 830 | 0.584 | 0.261 |
| 831 | 0.603 | 0.250 |
| 832 | 0.611 | 0.245 |
| 833 | 0.632 | 0.233 |
| 834 | 0.642 | 0.228 |
| 835 | 0.664 | 0.217 |
| 836 | 0.679 | 0.210 |
| 837 | 0.700 | 0.200 |
| 838 | 0.720 | 0.190 |
| 839 | 0.739 | 0.182 |
| 840 | 0.766 | 0.171 |
| 841 | 0.782 | 0.165 |
| 842 | 0.816 | 0.153 |
| 843 | 0.829 | 0.148 |
| 844 | 0.870 | 0.135 |
| 845 | 0.880 | 0.132 |
| 846 | 0.925 | 0.119 |
| 847 | 0.937 | 0.115 |
| 848 | 0.980 | 0.105 |
| 849 | 1.000 | 0.100 |
| 850 | 1.036 | 0.092 |
| 851 | 1.068 | 0.085 |
| 852 | 1.089 | 0.082 |
| 853 | 1.142 | 0.072 |
| 854 | 1.142 | 0.072 |
| 855 | 1.213 | 0.061 |
| 856 | 1.201 | 0.063 |
| 857 | 1.275 | 0.053 |
| 858 | 1.275 | 0.053 |
| 859 | 1.323 | 0.048 |
| 860 | 1.355 | 0.044 |

TABLE 3

Example Showing Results Using Equalization Optical Filter 50

| $\lambda_{laser}$, Wavelength | $P_{laser}$ for Equal Energy Deposition in Colorant Layer | Energy Deposited in Donor Colorant Layer | Light Transmitted by Donor | Ratio of $P_{sensor}$ to $P_{colorant}$ | Light Passing through Equalization Optical Filter to Reach Sensor |
|---|---|---|---|---|---|
| 810 nm | 248 mW | 171 mW | 61 mW | 1 | 171 mW |
| 840 nm | 500 mW | 171 mW | 287 mW |   | 171 mW |
| 810 nm | 248 mW | 171 mW | 61 mW | 0.5 | 86 mW |
| 840 nm | 500 mW | 171 mW | 287 mW |   | 86 mW |

TABLE 4

Example Showing Equalization Optical Filter 50 Transmittance, with Sensor Compensation

| $\lambda$, Wavelength (nm) | T, Transmittance of Optical Filter with 803 nm Peak Normalized to Unity |
|---|---|
| 790 | 0.963 |
| 791 | 0.966 |
| 792 | 0.972 |
| 793 | 0.976 |
| 794 | 0.982 |
| 795 | 0.985 |
| 796 | 0.989 |
| 797 | 0.993 |
| 798 | 0.995 |
| 799 | 0.997 |
| 800 | 0.999 |
| 801 | 0.999 |

TABLE 4-continued

Example Showing Equalization Optical Filter 50 Transmittance, with Sensor Compensation

| λ, Wavelength (nm) | T, Transmittance of Optical Filter with 803 nm Peak Normalized to Unity |
|---|---|
| 802 | 0.999 |
| 803 | 1.000 |
| 804 | 0.998 |
| 805 | 0.997 |
| 806 | 0.995 |
| 807 | 0.993 |
| 808 | 0.989 |
| 809 | 0.985 |
| 810 | 0.981 |
| 811 | 0.976 |
| 812 | 0.970 |
| 813 | 0.962 |
| 814 | 0.956 |
| 815 | 0.946 |
| 816 | 0.938 |
| 817 | 0.926 |
| 818 | 0.918 |
| 819 | 0.904 |
| 820 | 0.895 |
| 821 | 0.877 |
| 822 | 0.868 |
| 823 | 0.847 |
| 824 | 0.836 |
| 825 | 0.813 |
| 826 | 0.802 |
| 827 | 0.776 |
| 828 | 0.764 |
| 829 | 0.735 |
| 830 | 0.721 |
| 831 | 0.690 |
| 832 | 0.676 |
| 833 | 0.642 |
| 834 | 0.627 |
| 835 | 0.595 |
| 836 | 0.575 |
| 837 | 0.548 |
| 838 | 0.521 |
| 839 | 0.499 |
| 840 | 0.468 |
| 841 | 0.451 |
| 842 | 0.416 |
| 843 | 0.404 |
| 844 | 0.367 |
| 845 | 0.358 |
| 846 | 0.322 |
| 847 | 0.313 |
| 848 | 0.283 |
| 849 | 0.270 |
| 850 | 0.248 |
| 851 | 0.230 |
| 852 | 0.220 |
| 853 | 0.194 |
| 854 | 0.194 |
| 855 | 0.164 |
| 856 | 0.169 |
| 857 | 0.142 |
| 858 | 0.142 |
| 859 | 0.127 |
| 860 | 0.118 |

Although narrowband light sources have been used to illustrate explanations of this embodiment, this invention also applies to broadband light sources as long as the photodetector does not receive light outside the wavelength range for which the colorant-layer absorptance spectrum agrees within a multiplicative constant with the product of the equalization-optical-filter 50 transmittance profile and the photodetector wavelength sensitivity of sensor 26.

Equalization optical filter 50 must exhibit the transmittance profile corresponding to the colorant-layer absorptance when equalization optical filter 50 is illuminated with the numerical aperture of light existing at the position for the equalization optical filter 50 in the printer. This numerical aperture may approach a large value of 0.5 N.A. after dispersal of the light by a scattering material used as a wavelength-independent optical attenuator 28. In a second embodiment of the present invention, equalization optical filter 50 may be implemented as an interference filter. A filter of the interference type must accommodate the shift in cutoff wavelength of its transmitted light as that light's incidence angle changes with respect to the surface of the interference filter. The interference filter must be designed so that its cumulative transmittance for the amounts of light constituting the numerical aperture, rather than that interference filter's steeper transmittance profile for collimated light incident at a single angle, matches the absorption spectrum of the colorant layer within a multiplicative constant.

Figure 11A:
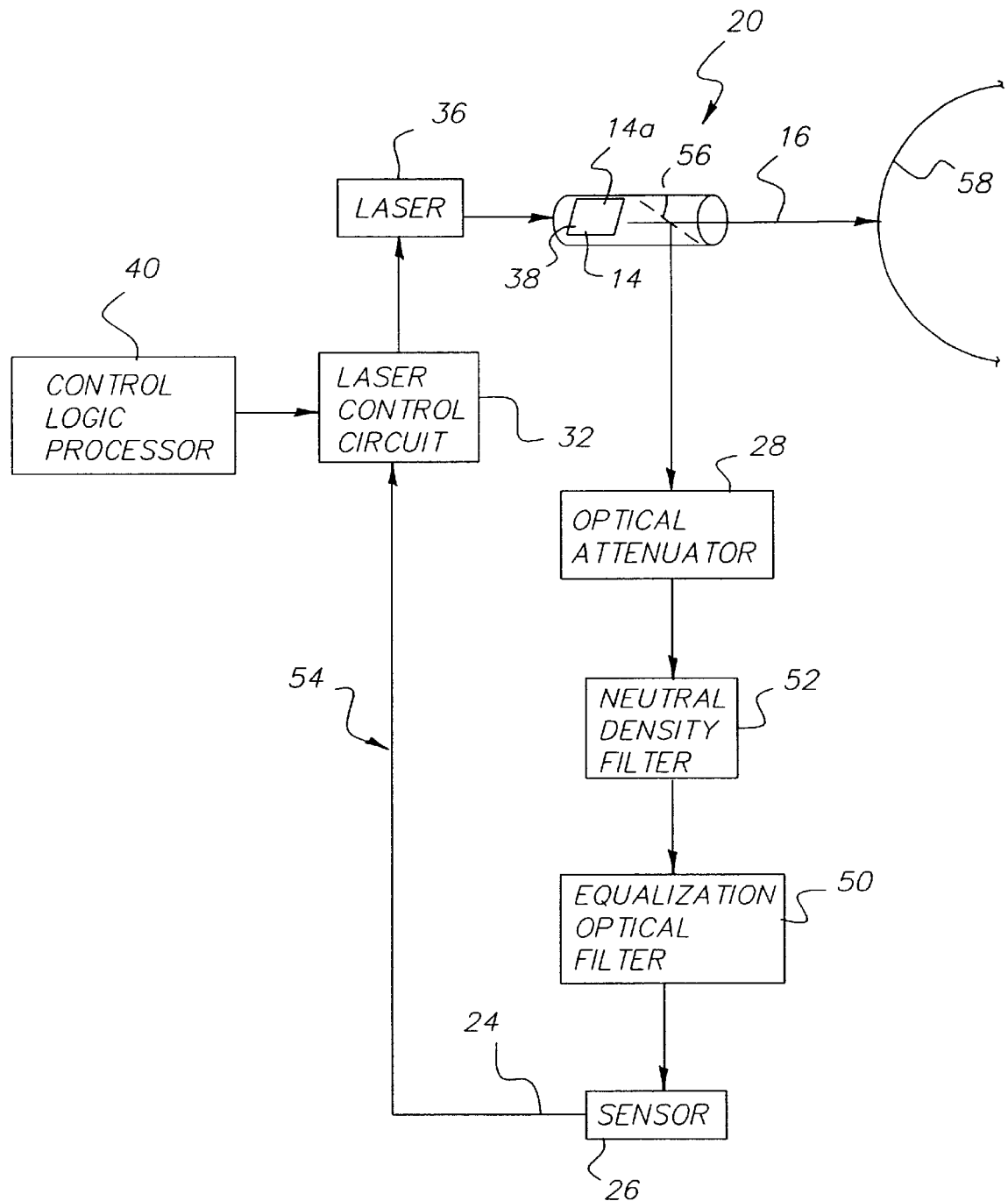
FIG. 11a is a schematic view of a feedback control loop using the equalization optical filter of the present invention.

Referring to FIG. 11a, there is shown a third embodiment of the present invention. Here, equalization optical filter 50 is disposed in a feedback loop 54 that operates during exposure of an image-recording medium 58. A beamsplitter 56 diverts a sampled portion of the energy emitted by the printhead 20, through equalization optical filter 50, optional neutral density filter 52, and optional optical attenuator 28, to sensor 26. Sensor feedback signal 24 is monitored by laser control circuit 32 to adjust the laser power in response to changes in the wavelength distribution of emitted power so that constant power is deposited on image-recording medium 58. Feedback loop 54 allows printhead 20 to accommodate for spectral change of printhead 20 components and lasers 36, rather than assuming that printhead 20 emits only at predetermined wavelengths. This feedback control might cause total emitted power to vary due to changes in emitted wavelength. However, since the effective energy applied for image formation does not change, the image density remains constant. For instance, diode lasers 36 are known to increase their emission wavelength about 0.3 nm/°C. due to thermal expansion of their laser cavity. A nominally 830 nn diode laser heating by 10° C. during the course of writing an image would deposit only 89% of the energy in the colorant layer of the yellow donor at the end of that image as compared to the beginning, if the laser power were maintained constant. Feedback control incorporating equalization optical filter 50 would, in response to detecting less transmission through equalization optical filter 50 due to the increasing wavelength of that emission, increase the laser to 1.12 of its beginning power, thereby compensating for its lessened effect upon image-recording medium 58. Preferred feedback control of each laser in a multiple-source printhead would be afforded by independent detection of each laser. This independent detection might be accomplished by recording the sensor reading when only one source is emitting radiation, a condition which could be determined: by assessing the signal activating each source during image exposure; or by alternating between a monitoring sequence and exposure of the image-recording medium, activating only one source 14 at a time during that monitoring sequence and recording in control logic processor 40 the signal 24 from the sensor 26. Another way to independently observe multiple sources would be to image the light in the optical feedback loop onto an array of calibrating sensors 26 positioned appropriately so that each source is observed by a single sensor and recorded by the control logic processor 40; re-adjustment of each source could be performed during the exposure of the image-recording medium. In a typical embodiment, sensor 26, equalization optical filter 50, optional neutral density filter 52, and optical attenuator 28 would be mounted with printhead 20, such as on a translation assembly that controls printhead 20 movement.

Figure 11B:
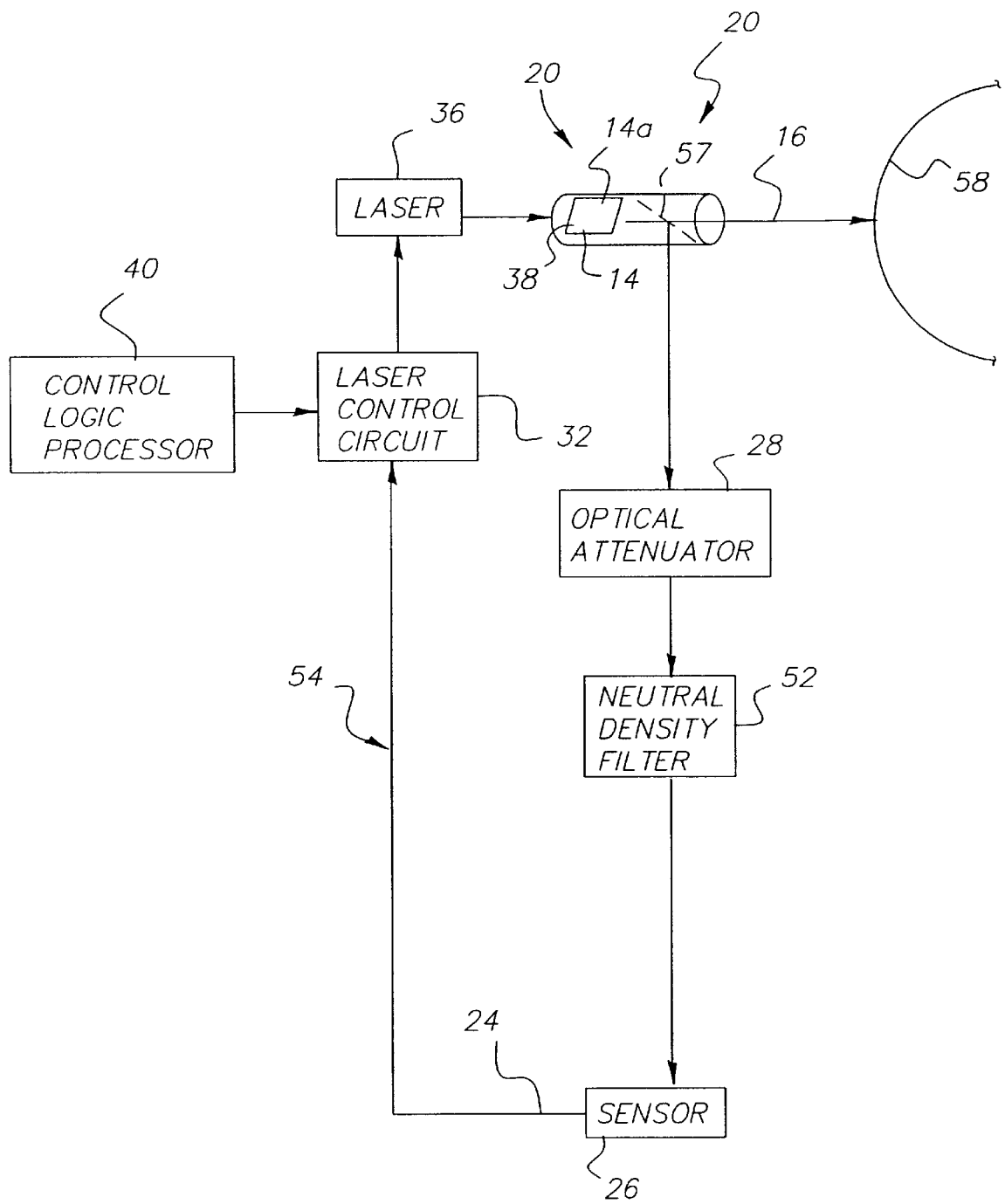
FIG. 11b is a schematic view of a feedback control loop using an equalization optical beamsplitter.

The functions of beamsplitter 56 and equalization optical filter 50 could be combined into an equalization optical filtering beamsplitter 57, as shown in FIG. 11b alone by modifying that filtering beamsplitters reflectance with respect to wavelength, $R_{filtersplitter}[\lambda]$ while accommodating change in power directed to the image-recording medium consequent to the corresponding wavelength dependence of transmittance $T_{filterspitter}[\lambda]$ of that filtering beamsplitter. Assuming no internal absorption by the filtering beamsplitter: Conservation of light energy in Equation (1) applies to the filtering beamsplitter:

$$T_{filtersplitter}[]=1-R_{filtersplitter}[\lambda]-A_{filtersplitter}[\lambda] \quad (13)$$

Equation (3) must be generalized for this wavelength-dependent transmission of the filtering beamsplitter in order to maintain equal power deposited in the donor colorant layer throughout the wavelength range:

$$P_{colorant}[\lambda_{laser}]=P_{laser}[\lambda_{laser}]\times T_{filtersplitter}[\lambda_{laser}]\times A_{colorant}[\lambda_{laser}] \quad (14)$$

Equation (14) and the analog of equation (11) for a filtering beamsplitter:

$$F_{sensor,goal}=P_{laser}[\lambda_{laser}]\times R_{filtersplitter}[\lambda_{laser}]\times S_{sesor}[\lambda_{laser}] \quad (15)$$

can be satisfied simultaneously if the filtering beamsplitters reflectance is designed according to equation (16):

$$R_{filtersplitter}[\lambda] = \frac{1}{1+\frac{S_{sensor}[\lambda]}{A_{colorant}[\lambda]}\frac{P_{colorant,goal}}{F_{sensor,goal}}} \quad (16)$$

enabling maintenance of equal feedback signal $F_{sensor}[\lambda]$ when equal power is deposited in the donor colorant throughout the wavelength range. By applying equation (13) to the reflectance in equation (16), the appropriate transmittance of the beamsplitting filter directing exposing light to the image-recording medium is:

$$T_{filtersplitter}[\lambda] = \frac{1-A_{filtersplitter}[\lambda]}{1+\frac{A_{colorant}[\lambda]}{S_{sensor}[\lambda]}\frac{F_{sensor,goal}}{P_{colorant,goal}}} \quad (17)$$

Note that the absorptance $A_{filtersplitter}[\lambda]$ of the beamsplitting filter is not required to have any relationship with the spectral sensitivity of the image-recording medium; equations (13) and (17) simply specify the way to accommodate any inherent absorptance of that beamsplitting filter. If the filtering beamsplitter diverts only a small fraction of the source radiation 16 to the sensor 26, equation (16) for the filtering beamsplitters reflectance reduces to equation (12) for the transmittance of the equalization filter.

While printhead 20 in the preferred embodiment uses an array of lasers 36, printhead 20 might alternately use a single laser 36 or other exposure energy source. In such an embodiment, the method of the present invention could use equalization optical filters 50 in multiple printers to ensure that the several printers produce identical results on the same type of image-recording material. Printhead 20 can be used to write onto any of a number of different imaging media types, including donor sheets, printing plates, and photosensitive materials. Where a donor sheet is used, the donor can comprise any suitable type of colorant, such as a dye, ink, pigment, metal layer, diffractive material, liquid crystal, or other colorant. The final image might be produced on the donor sheet with no need for a receiver medium. Image-recording medium 58 can operate by image-forming interactions dependent upon the energy deposited by the absorbed light other than heat generation, such as by photochemical reactions utilized in photographic film. While preferred embodiment uses a light source, the present invention can use visible light as well as radiated electromagnetic energy from the broader electromagnetic spectrum, including infrared radiation or ultraviolet radiation. Sensitivity characteristics of the medium may be embedded on the medium by means of a chip, barcode, or other indicia. Thus, when the medium is loaded into the image processing apparatus the characteristics of the medium are detected and used as input for the control circuitry. In one embodiment filters may be changed out based on the sensed characteristics of the medium.

Therefore, what is provided is a printhead adapted to the wavelength sensitivity of an image recording material and a method for equalizing output power deposited by the printhead in the image recording material.

Parts List

10. Image producing apparatus
12. Imaging drum
14. Light source array
14a. Light source
14b. Light source
14n. Light source
16. Beam
18. Lead screw
20. Printhead
24. Feedback signal
26. Sensor
28. Optical attenuator
30. Calibration control loop
32. Laser control circuit
34. Calibration station
36. Diodelaser
36a. Diode laser
36b. Diode laser
36n. Diode laser
38. Optical fiber
40. Control logic processor
50. Equalization optical filter
52. Neutral density filter
54. Feedbackloop
56. Beamsplitter
58. Image-recording medium

What is claimed is:

1. A feedback-control station for a printhead adapted to provide a beam of electromagnetic radiation from a variable electromagnetic energy source onto a radiation sensitive medium said feedback-control station comprising:

a sensor disposed for sensing said beam provided by said printhead, wherein said sensor provides an output sensor signal indicative of a sensed power of said beam;

a control circuit adapted to accept said output sensor signal from said sensor, wherein said control circuit adjusts said variable electromagnetic energy source;

a filter disposed in the path of said beam between said printhead and said sensor as well as between said printhead and said radiation sensitive medium, said filter adapted to convey to said sensor a first portion of incident electromagnetic radiation and to convey to said radiation sensitive medium a second portion of incident electromagnetic radiation over a predefined range of wavelengths dependent upon a response characteristic of said radiation sensitive medium; and wherein response characteristics of said radiation sensitive medium are recorded on said medium.

2. The feedback-control station of claim 1 wherein said beam of electromagnetic radiation is comprised of multiple beams.

3. The feedback-control station of claim 1 wherein said beam of electromagnetic radiation is in a visible spectrum.

4. The feedback-control station of claim 1 wherein said beam of electromagnetic radiation is in an infrared spectrum.

5. The feedback-control station of claim 1 wherein said sensor is a photodiode.

6. The feedback-control station of claim 1 wherein said medium comprises a colorant donor.

7. The feedback-control station of claim 6 wherein said colorant donor comprises a dye.

8. The feedback-control station of claim 6 wherein said colorant donor comprises a pigment.

9. The feedback-control station of claim 6 wherein said colorant donor comprises an ink.

10. The feedback-control station of claim 1 wherein said medium comprises a printing plate.

11. The feedback-control station of claim 1 wherein said variable electromagnetic energy source is a laser.

12. The feedback-control station of claim 1 wherein said variable electromagnetic energy source is a diode laser.

13. The feedback-control station of claim 1 wherein said variable electromagnetic energy source is a LED.

14. The feedback-control station of claim 1 wherein said variable electromagnetic energy source is an x-ray emitter.

15. The feedback-control station of claim 1 wherein said variable electromagnetic energy source is incandescent lamp.

16. The feedback-control station of claim 1 wherein said variable electromagnetic energy source is a halogen lamp.

17. The feedback-control station of claim 1 wherein said variable electromagnetic energy source is an arc lamp.

18. The feedback-control station of claim 1 wherein said filter is an absorptive filter.

19. The feedback-control station of claim 1 wherein said filter is an interference filter.

20. The feedback-control station of claim 1 further comprising a scattering medium which attenuates said beam, located between said printhead and said sensor.

21. The feedback-control station of claim 1 wherein said control circuit adjusts said variable electromagnetic energy source by varying a drive current to said variable electromagnetic energy source.

22. The feedback-control station of claim 1 wherein said control circuit adjusts said variable electromagnetic energy source by varying a time interval of a pulse width delivered to said variable electromagnetic energy source.

23. The feedback-control station of claim 1 wherein said control circuit adjusts said variable electromagnetic energy source during exposure of said sensitive medium.

24. The feedback-control station of claim 1 wherein said beam of electromagnetic radiation is an ultraviolet beam.

25. The feedback-control station of claim 1 wherein said radiation sensitive medium is a silver halide material.

26. The feedback-control station of claim 1 wherein said radiation sensitive medium is a photolithographic slide.

27. The feedback-control station of claim 1 wherein said sensor senses the response characteristics of said radiation sensitive medium.

28. The feedback-control station as in claim 1 wherein said filter is replaced to match the response characteristics of said radiation sensitive medium.

29. A feedback-control station for a printhead adapted to provide a beam of electromagnetic radiation from a variable electromagnetic energy source onto a radiation sensitive medium said feedback-control station comprising:

a sensor disposed for sensing said beam provided by said printhead, wherein said sensor provides an output sensor signal indicative of a sensed power of said beam;

a control circuit adapted to accept said output sensor signal from said sensor, wherein said control circuit adjusts said variable electromagnetic energy source;

a filter disposed in the path of said beam between said printhead and said sensor as well as between said printhead and said radiation sensitive medium, said filter adapted to convey to said sensor a first portion of incident electromagnetic radiation and to convey to said radiation sensitive medium a second portion of incident electromagnetic radiation over a predefined range of wavelengths dependent upon a response characteristic of said radiation sensitive medium; wherein:

said conveyance of said first portion of said beam of electromagnetic radiation to said sensor is accomplished by reflection from said filter acting as a beamsplitting filter;

said conveyance of said second portion of said beam of electromagnetic radiation to said radiation sensitive medium is accomplished by transmission through said beamsplitting filter;

said reflectance obeying relationship $$R_{filtersplitter}[\lambda] = \frac{1 - A_{filtersplitter}[\lambda]}{1 + \frac{S_{sensor}[\lambda]}{A_{colorant}[\lambda]} \frac{P_{colorant,goal}}{F_{sensor,goal}}}$$

while said transmission through said filter obeying relationship $$T_{filtersplitter}[\lambda] = \frac{1 - A_{filtersplitter}[\lambda]}{1 + \frac{A_{colorant}[\lambda]}{S_{sensor}[\lambda]} \frac{F_{sensor,goal}}{P_{colorant,goal}}};$$

wherein:

$\lambda$ is the wavelength of the beam of electromagnetic radiation from the variable electromagnetic energy source directed upon the radiation-sensitive medium;

$T_{filtersplitter}[\lambda]$ is the fraction of power of the beam of electromagnetic radiation from the variable electromagnetic energy source transmitted by the feedback-controlling filter at wavelength $\lambda$;

$R_{filtersplitter}[\lambda]$ is the fraction of power of the beam reflected by the feedback-controlling filter at wavelength $\lambda$;

$A_{filtersplitter}[\lambda]$ is the fraction of power of the beam absorbed by the feedback-controlling filter at wavelength $\lambda$;

$S_{sensor}[\lambda]$ is the signal produced by the calibration sensor in response to the power of the beam at wavelength $\lambda$;

$F_{sensor,goal}$ is the signal produced by the calibration sensor in response to the power of the beam directed upon said sensor by the feedback-controlling filter when the power of said beam directed simultaneously upon the radiation-sensitive medium by the feedback-controlling filter at the same wavelength produces the goal level of response; and $P_{colorant,goal}$ is the power of the beam absorbed in the radiation-sensitive medium producing the goal level of response.

30. The feedback-control station of claim 29 wherein: said filter is a beamsplitting filter.

* * * * *